United States Patent
Nakae

Patent Number: 5,867,253
Date of Patent: Feb. 2, 1999

[54] METHOD OF CORRECTING LIGHT PROXIMITY EFFECT

[75] Inventor: Akihiro Nakae, Hyogo, Japan

[73] Assignee: Mitsubishi Denki Kabushiki Kaisha, Tokyo, Japan

[21] Appl. No.: 800,903

[22] Filed: Feb. 12, 1997

[30] Foreign Application Priority Data

Sep. 30, 1996 [JP] Japan .................................. 8-259246

[51] Int. Cl.$^6$ ...................................... G03B 27/54
[52] U.S. Cl. ............................ 355/52; 355/93; 355/67; 355/71
[58] Field of Search .................. 355/52, 53, 67, 355/71

[56] References Cited

FOREIGN PATENT DOCUMENTS 56-83030  7/1981  Japan .
5-160010  6/1993  Japan .

OTHER PUBLICATIONS

Otto, Oberdan W., et al., "Automated Optical proximity correction–a rules–based approach", Optical/Laser Microlithography VII, Timothy A. Brunner, Editor, Proc. SPIE 2197, pp. 278–293, (Mar. 2–4, 1994).

Primary Examiner—Daniel Malley
Attorney, Agent, or Firm—McDermott, Will & Emery

[57] ABSTRACT

According to a method of correcting light proximity effect, a decision distance from one exposure point to the other exposure point, where influence of the light proximity effect appears, as well as a reference area ratio for deciding as to whether the light proximity effect correction is necessary or not are determined based on an optical condition of an exposure apparatus having a photomask attached thereto. Respective sides of a photomask pattern are divided into portions each having at most a prescribed length, and a ratio of an area occupied by the photomask pattern to an area of a circle having a middle point of each divided side as a center and the decision distance as a radius is determined for each of the divided sides. Comparing the area ratio for each of the divided sides with the reference area ratio for decision, a decision is made for each divided side as to whether the light proximity effect correction is necessary or not. Using this method, time required for calculation can be reduced, and highly precise correction can be made.

6 Claims, 13 Drawing Sheets

RATIO OF AREA OF PHOTOMASK
PATTERN (SHADING PORTION) (%)

RESIST A; MITSUBISHI CHEMICAL CORPORATION, I-LINE POSIRESIST
i8300B (FILM THICKNESS 7500 Å)

RESIST B; MITSUBISHI CHEMICAL CORPORATION, I-LINE POSIRESIST
i8000 (FILM THICKNESS 7500 Å)

PHOTOMASK SHADING PATTERN

INTERCONNECTION PATTERN

5,867,253

METHOD OF CORRECTING LIGHT PROXIMITY EFFECT

BACKGROUND OF THE INVENTION

1. Field of the Invention

The present invention relates to a method of correcting light proximity effect, and more particularly relates to a method for efficiently correcting light proximity effect for data on photomask pattern.

2. Description of the Background Art

Miniaturization of a semiconductor device has been accompanied by such problems as deterioration in precision of finished dimension as well as change in a shape of an interconnection pattern due to the light proximity effect produced in a semiconductor element constituting the semiconductor device.

Depending on arrangement (such as line width, pitch) of a pattern formed on a photomask, optical image of exposure light transmitted through the photomask varies. This causes an error in the finished dimension of a resist film. This phenomenon is referred to as the light proximity effect. For example, assume that a resist film is exposed using a shading pattern of a photomask having patterns P100 and P200, and an interconnection layer is patterned using the patterned resist film as shown in FIG. 13A. Shapes of interconnection patterns P100a and P200a change considerably, especially at the middle portions where the interconnection patterns oppose to each other as shown in FIG. 13B.

Main problems developed presently include shortening of a gate pattern of a logical semiconductor device, and error of a pattern width when the pattern width is constant but pitch is changed. Therefore, correction of light proximity effect has been studied recently.

According to a method of correcting light proximity effect now employed, as shown by the flow chart of FIG. 14, photomask data is prepared in step 100 (hereinafter referred to as S100), a light distribution simulation and a development simulation are carried out based on the photomask data in S200. Following the result of the simulations, a correction value for light proximity effect is determined in S300.

In S400, the photomask data is corrected based on the correction value for light proximity effect obtained in S300. Next in S500, using the corrected photomask data, the light distribution simulation and development simulation are again done. In S600, a decision is made about whether an amount of variation in dimension due to the light proximity effect converges or not, and if it does not converge, returning S300, similar steps are conducted. On the other hand, if the amount of variation in dimension due to the light proximity effect converges, correction of photomask data is completed in S700.

Photomask data for which light proximity effect is corrected can thus be obtained by repeating light distribution and development simulations until the amount of dimensional variation due to the light proximity effect converges.

According to the conventional method of correcting the light proximity effect for photomask pattern data described above, the simulation is run based on the photomask pattern data. Because of limitations of the device, an area for which the simulation can be done at a time is at most $1 \times 10^{-4}$ mm$^2$. The regular size of the entire photomask pattern is $4 \times 10^2$ mm$^2$, so that four million calculations are necessary in order to do one simulation for one photomask pattern. As described referring to FIG. 14, the time required for calculation in the simulation is considerable since the simulations are repeated until the amount of dimensional variation due to the light proximity effect converges.

SUMMARY OF THE INVENTION

An object of the present invention is to provide a method of correcting light proximity effect in which the number of simulations can be reduced and thus the time required for calculation can be reduced, and highly accurate correction can be made.

The method of correcting light proximity effect according to the present invention includes following steps.

First, a distance from an exposure point, where influence of the light proximity effect appears, is determined as a decision distance based on three values of wavelength, numerical aperture, and partial coherence of an exposure light source in an exposure apparatus to which a photomask is attached. Next, a circle having the exposure point as a center and the decision distance as a radius is drawn. Based on a ratio of an area of a photomask pattern to the circle, a reference area ratio is determined, for deciding whether the light proximity effect correction is necessary or not for the exposure point.

The respective sides of the photomask pattern are divided into portions each having at most a prescribed length. A circle having a middle point of the divided side as a center and the decision distance as a radius is drawn, and an area occupied by the photomask pattern in the circle is measured for each divided side.

Comparing a ratio of the area measured for each divided side with the reference area ratio for decision, a decision is made for each divided side as to whether the light proximity effect correction is necessary or not. For the divided side which needs the light proximity effect correction, photomask data is corrected based on an amount of dimensional variation due to the light proximity effect obtained according to the reference area ratio for decision.

According to the method of correcting the light proximity effect in the present invention, respective sides of the photomask pattern are divided into portions each of a prescribed length, a decision is made for each divided side as to whether the light proximity effect correction is necessary or not, and photomask pattern data is corrected only for the divided side which needs the light proximity effect correction. Therefore, the simulation is done only for the corrected data, and the calculation time required for the simulation is greatly reduced compared to the conventional method of correcting the light proximity effect in which the simulation is run for all the data.

Highly precise correction can be made by dividing each side of the photomask pattern as fine as possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The method of correcting the light proximity effect based on the present invention is hereinafter described with reference to the drawings.

First Embodiment

A method of correcting the light proximity effect according to the first embodiment will be described.

In the method of correcting the light proximity effect, data on a photomask pattern is corrected following the steps described below.

First, a distance (d) from a prescribed exposure point to another exposure point, when the prescribed exposure point is influenced by the proximity effect of another exposure point, is determined based on three values of wavelength ($\lambda$), numerical aperture (NA), and partial coherence ($\sigma$) of a light source of exposure in an exposure apparatus with a photomask attached thereto (the distance is hereinafter referred to as a decision distance (d1)).

Figure 1:
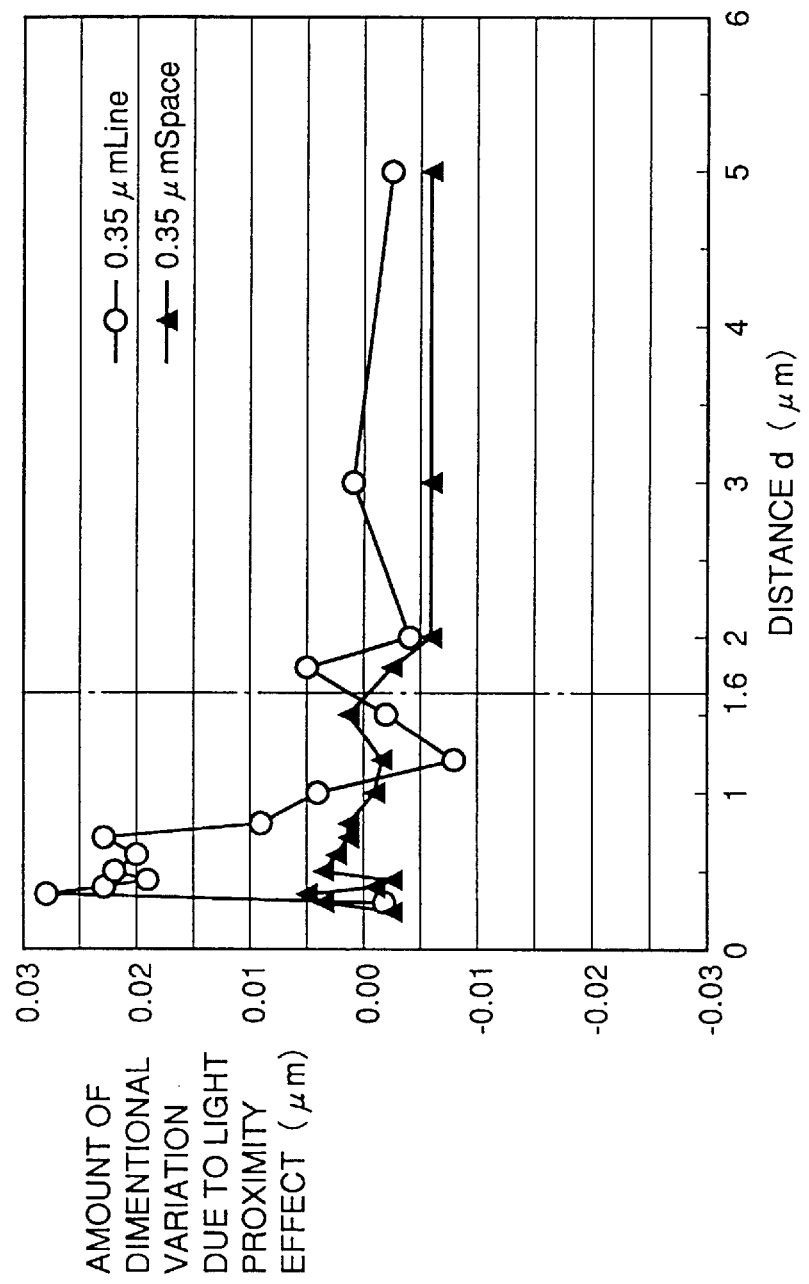
FIG. 1 shows a relation between the amount of dimensional variation due to the light proximity effect and the distance from the exposure point where influence of the light proximity effect appears in the first embodiment.

Decision distance (d1) can be derived from Equation (1) below.

$$d1 = \lambda/NA(1-\sigma) \tag{1}$$

d1: decision distance
$\lambda$: wavelength of exposure light source
$\sigma$: partial coherence
NA: numerical aperture If the optical conditions of Equation (1) are, for example, $\lambda=0.365$ $\mu$m (i-line), NA=0.57, and $\sigma=0.6$, decision distance (d1) becomes approximately 1.6 $\mu$m by substituting those values in Equation (1). This is clearly shown in the graphical representation according to a result of an experiment shown in FIG. 1. In the graph of FIG. 1, the ordinate shows an amount of variation in dimension due to the light proximity effect, and the abscissa shows a distance (d) which is influenced by the light proximity effect.

As shown in FIG. 1, for both of the 0.35 $\mu$m line pattern and the 0.35 $\mu$m space pattern, the amount of dimensional variation due to the light proximity effect is large when distance (d) is at most 1.6 $\mu$m,. However, the amount of dimensional variation due to the light proximity effect converges on a constant value when distance (d) exceeds 1.6 $\mu$m. Decision distance (d1) is thus determined.

Secondly, a circle having an exposure point as a center and decision distance (d1) as a radius is drawn. Based on a ratio of an area occupied by a photomask pattern in the circle, a decision is made as to whether the light proximity effect correction is necessary for the exposure point. (The area is hereinafter referred to as a reference area ratio for decision).

Figure 2:
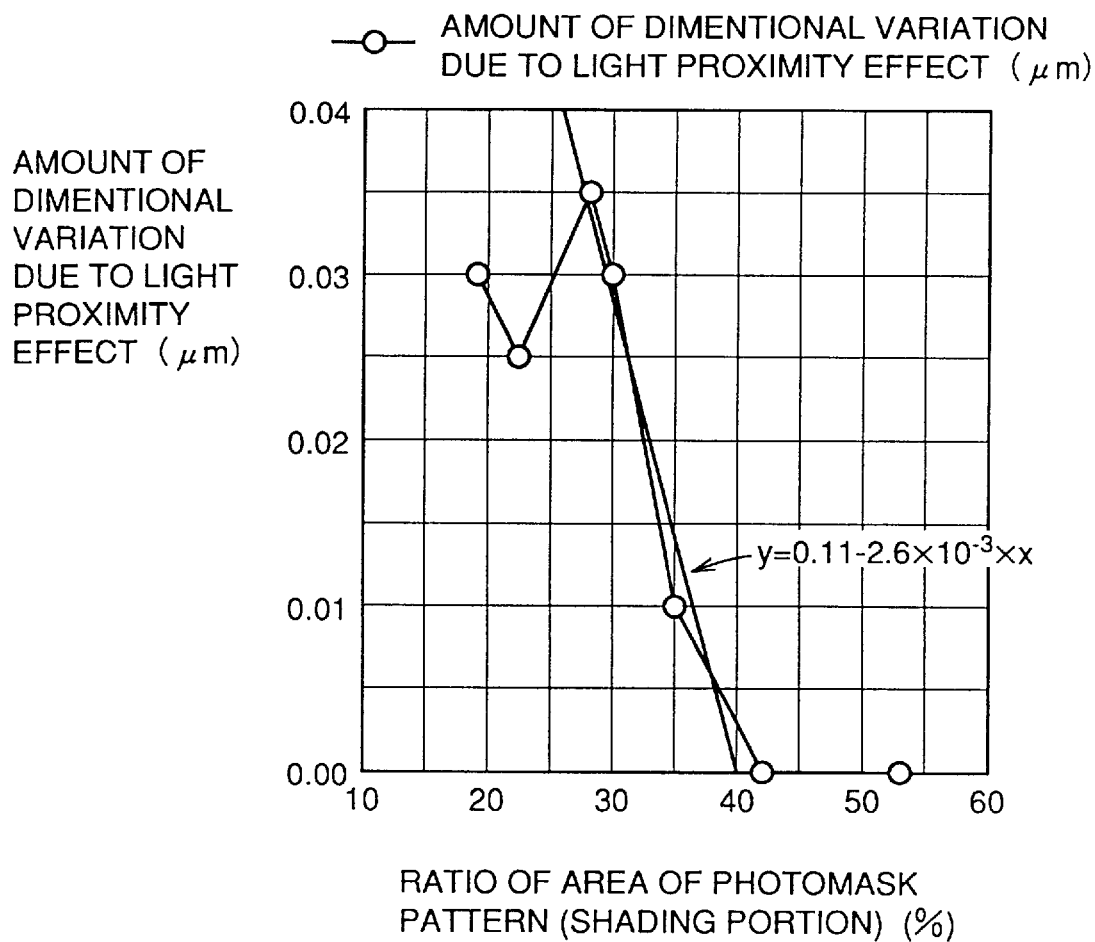
FIG. 2 shows a relation between the amount of dimensional variation due to the light proximity effect and the ratio of the area occupied by the photomask pattern (shading portion) in the first embodiment.

FIG. 2 shows a ratio (%) of an area occupied by a photomask pattern (shading portion) on the abscissa, and an amount of dimensional variation due to the light proximity effect on the ordinate, when the optical conditions are the same as those described above, and decision distance (d1) is 1.6 $\mu$m.

As shown in FIG. 2, if the area ratio of the photomask pattern is 40% or more, the amount of dimensional variation due to the light proximity effect is 0. In this case, a correction for the amount of dimensional variation due to the light proximity effect is determined to be unnecessary. On the other hand, if the area ratio of the photomask pattern is 30% or less, the amount of dimensional variation due to the light proximity effect is 0.03 $\mu$m±0.005 ($\mu$m), and a correction for the amount of dimensional variation due to the light proximity effect is determined to be necessary.

When the area ratio of the photomask pattern is between 30% and 40%, the area ratio is almost inversely proportional to the amount of dimensional variation due to the light proximity effect. In this case, the amount of dimensional variation can be derived approximately from Equation (2) below.

$$Y=0.11-2.6\times10^{-3}\times x \tag{2}$$

(y: amount of dimensional variation due to the light proximity effect, x: area ratio of photomask pattern (shading portion))

Accordingly, a correction for the amount of dimensional variation due to the light proximity effect is necessary.

It will be appreciated from the description above that, based on the reference area ratio for decision determined under the optical conditions above, a correction for the amount of dimensional variation due to the light proximity effect is necessary when the area ratio is at most 40%, and unnecessary when the area ratio exceeds 40%. If the area ratio is 30% or less, an amount of correction is 0.03 $\mu$m±0.005 ($\mu$m) which is the amount of dimensional variation due to the light proximity effect, and if the area ratio is between 30% and 40%, an amount of correction can be determined by Equation (2).

Figure 3:
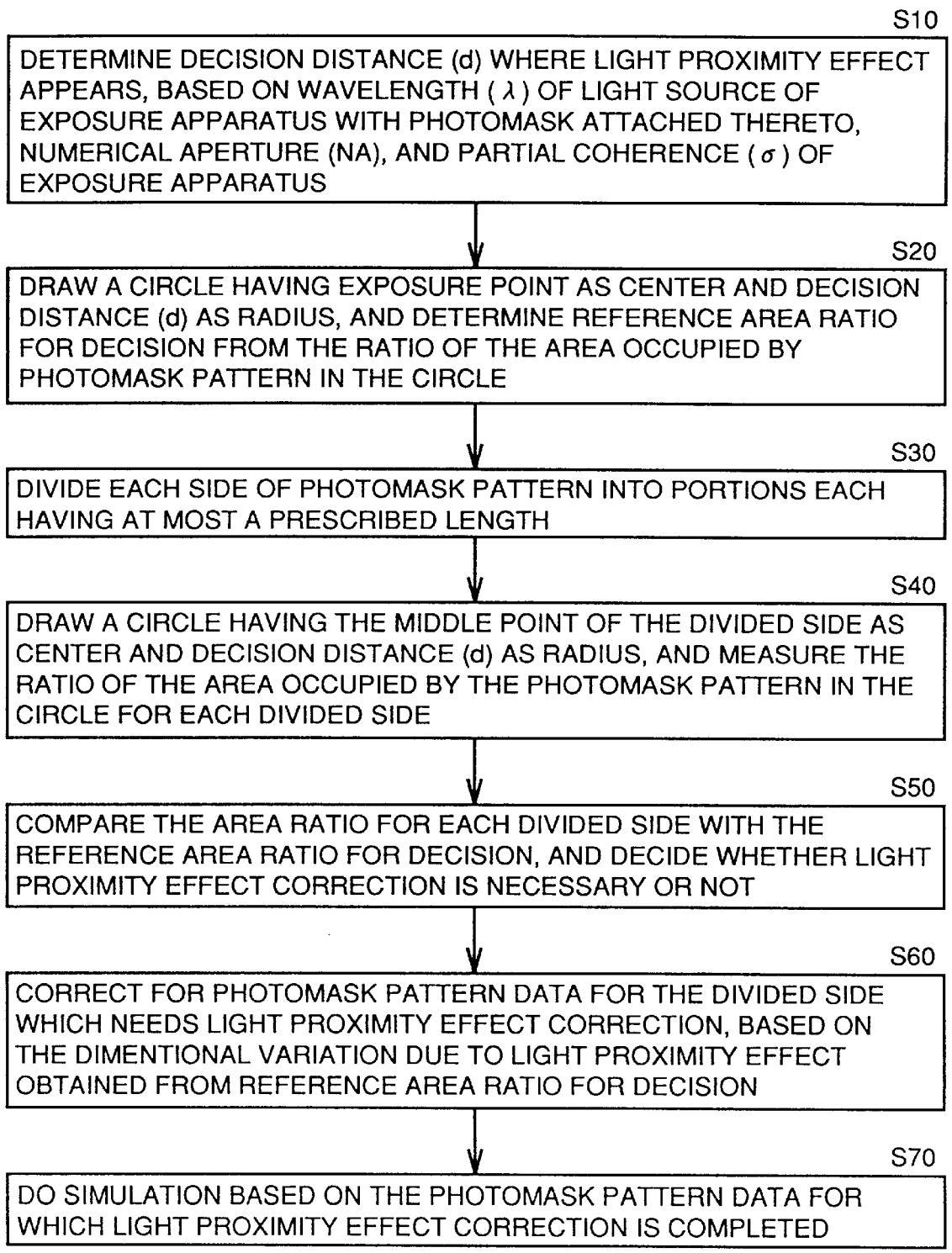
FIG. 3 is a flow chart showing a method of correcting the light proximity effect in the first embodiment.

FIG. 3 shows actual steps for correcting light proximity effect for data on the photomask pattern formed on a photomask. FIGS. 4–8 show photomask patterns used for describing each of the steps shown in FIG. 3. It is noted that the optical conditions are the same as those described above.

Steps 10 and 20 in the flow chart of FIG. 3 show two characteristics of the method of correcting the light proximity effect.

Figure 4:
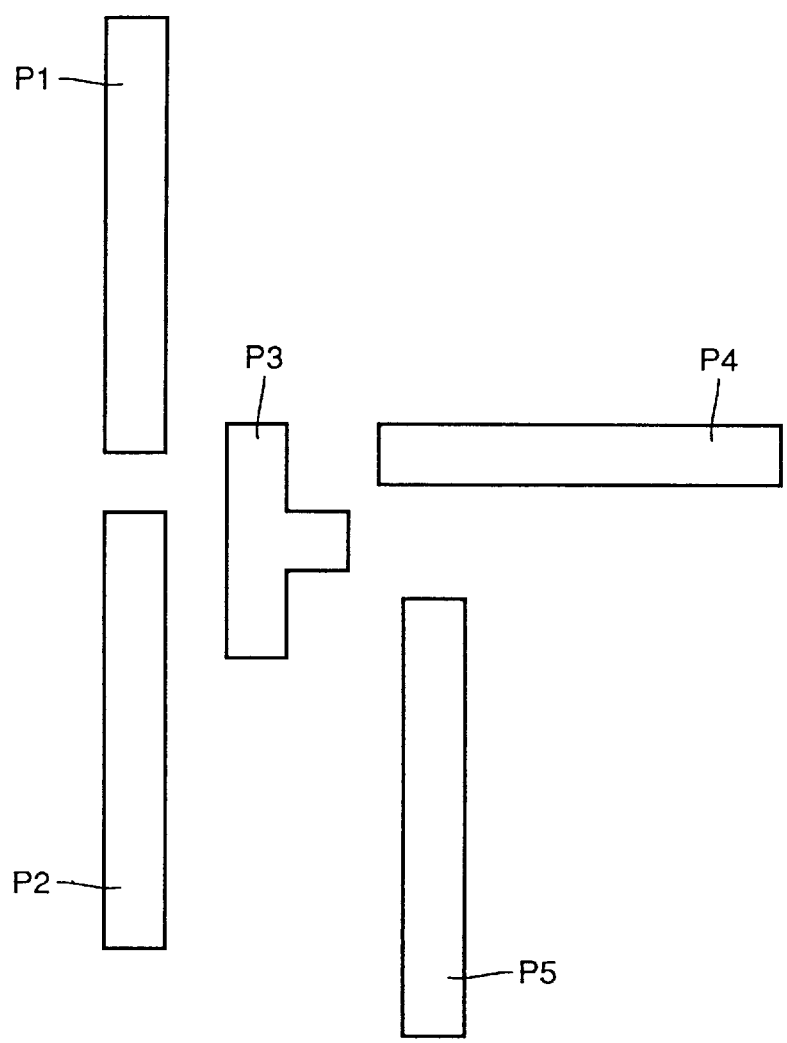
FIGS. 4–8 are the first to the fifth illustrations of the patterns formed on the photomask.

FIG. 4 shows a pattern to be formed on a photomask. Patterns P1–P5 respectively having a plurality of different shapes are formed at prescribed positions, constituting a shading portion of the photomask pattern.

Figure 5:
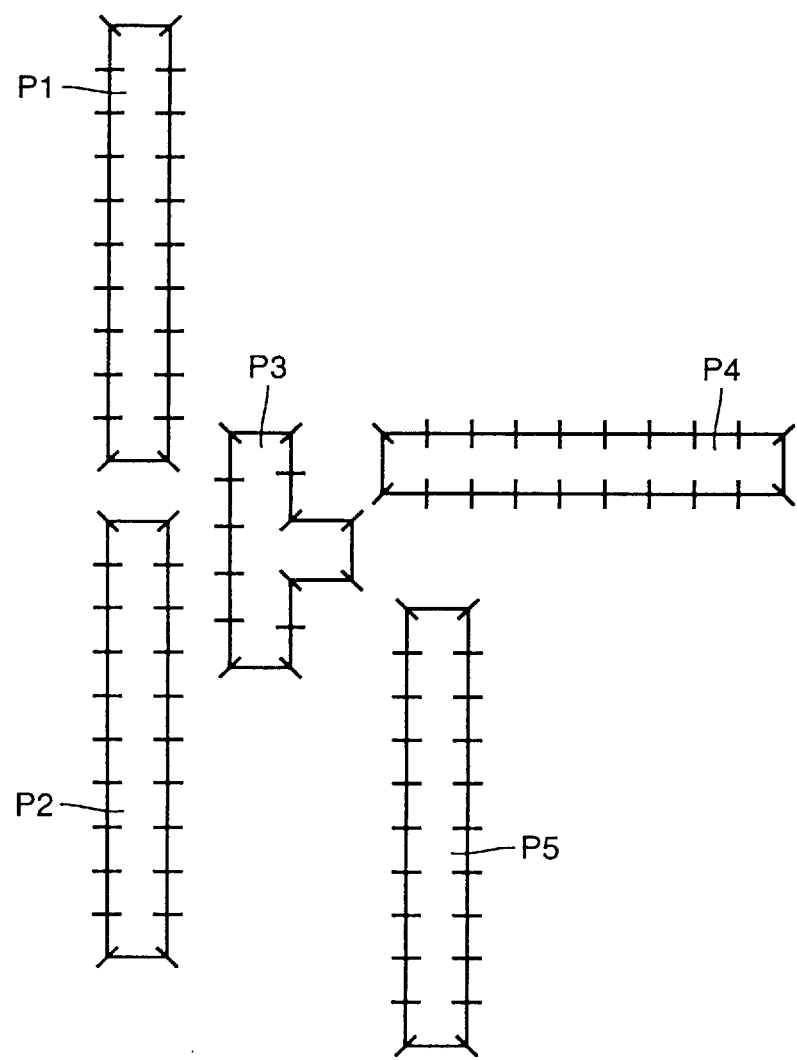

With reference to FIG. 5 next, respective sides of photomask patterns P1–P5 are divided into portions each having a length of at most 0.30 $\mu$m. This step corresponds to S30 shown in FIG. 3.

Figure 6:
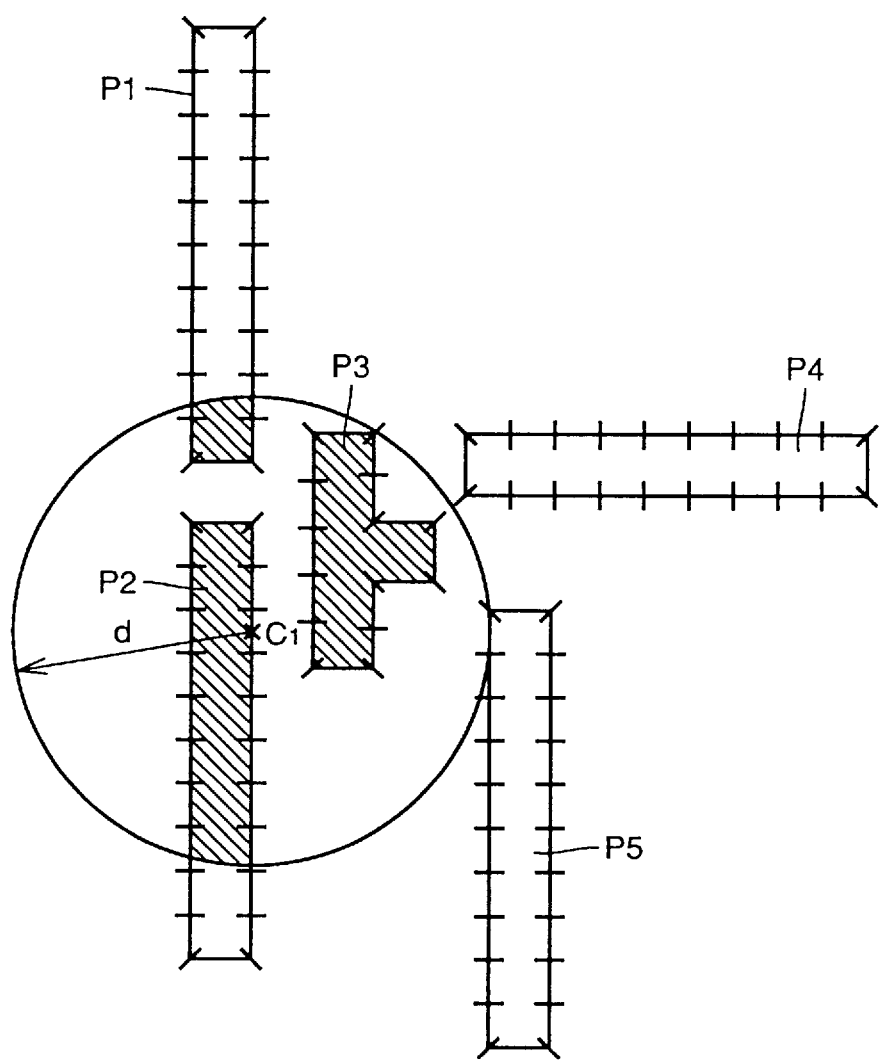

Referring to FIG. 6, a circle is drawn having a middle point ($C_1$) of the divided side as a center and decision distance (d1=1.6 μm) as a radius. A ratio of an area occupied by the photomask pattern in the circle is measured for all of the divided sides. This step corresponds to S40 shown in FIG. 3.

Figure 7:
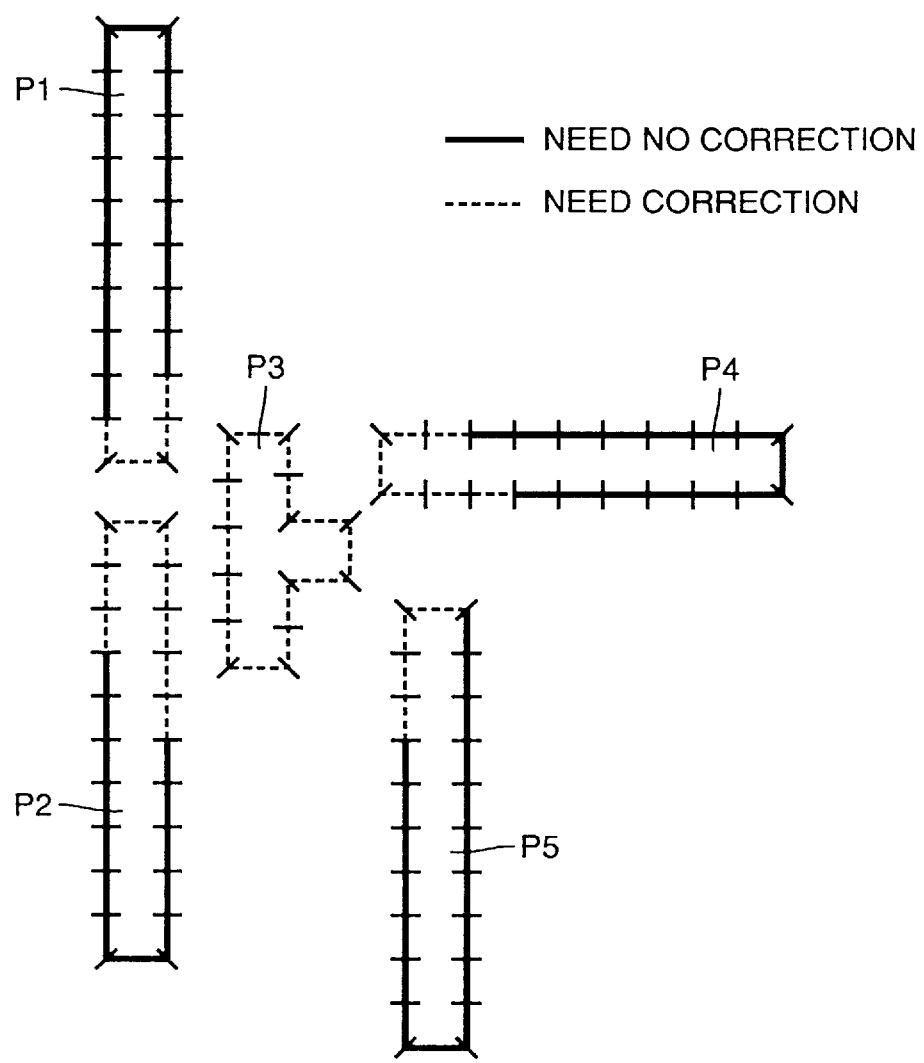

With reference to FIG. 7, comparing the area ratio for each divided side with the reference area ratio for decision determined as shown in FIG. 2, a decision is made for each divided side as to whether a correction for the light proximity effect is necessary or not. This step corresponds to step 50 in FIG. 3. FIG. 7 shows a result of the decision as to whether the light proximity effect correction is necessary or not. The divided side not to be corrected for the light proximity effect is shown in the bold line and the divided side to be corrected is shown in the dotted line.

Figure 8:
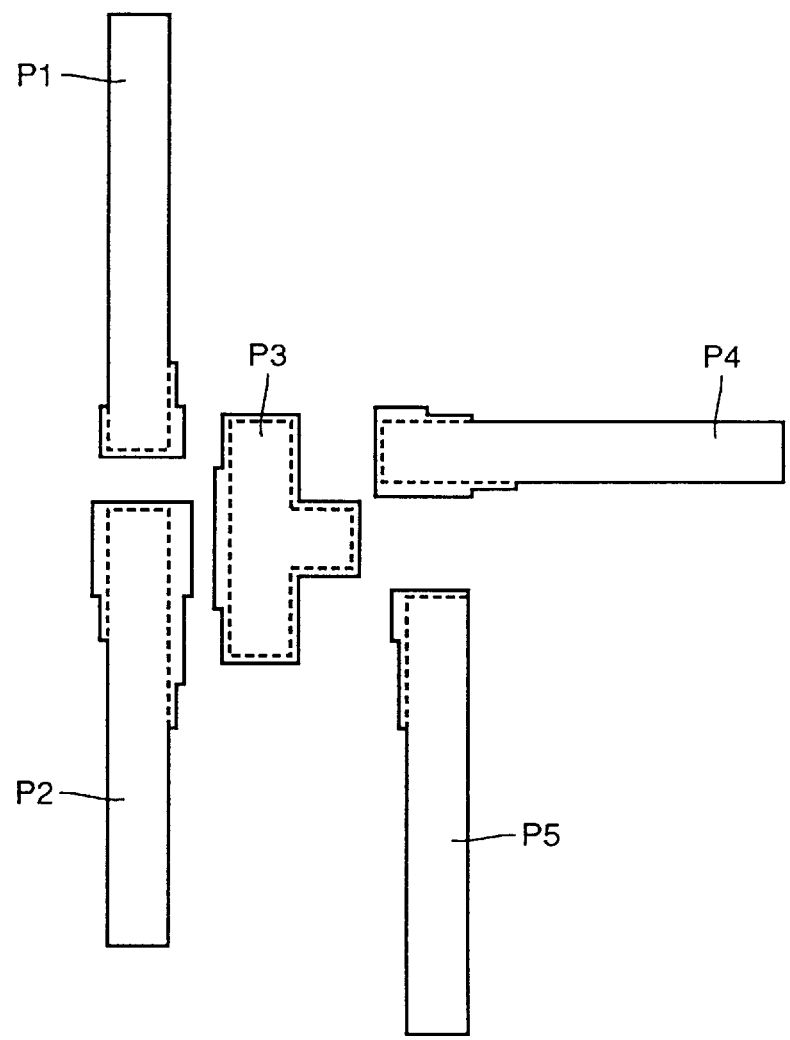

With reference to FIG. 8, data on the photomask pattern is corrected for the divided side to be corrected for the light proximity effect, based on the amount of dimensional variation due to the light proximity effect obtained from the reference area ratio for decision shown in FIG. 2. This step corresponds to S60 shown in FIG. 3.

The amount of dimensional variation due to the light proximity effect can be derived from Equation (2) when the area ratio of the photomask pattern is between 30% and 40%. If the area ratio of the photomask pattern is 30% or less, correction can be uniformly made using the amount (0.03 μm) of dimensional variation due to the light proximity effect.

FIG. 8 shows the photomask pattern after the data is corrected. Based on the corrected data, the light distribution simulation and the development simulation are done. However, the simulation is unnecessary for the divided side which needs no correction.

Therefore, simulation is done only for the divided side for which data is corrected. Time required for calculation in the simulation can be reduced compared with the conventional method of correction for the light proximity effect. Highly precise correction can be made since the length of the divided side is 0.30 μm.

Second Embodiment

Figure 9:
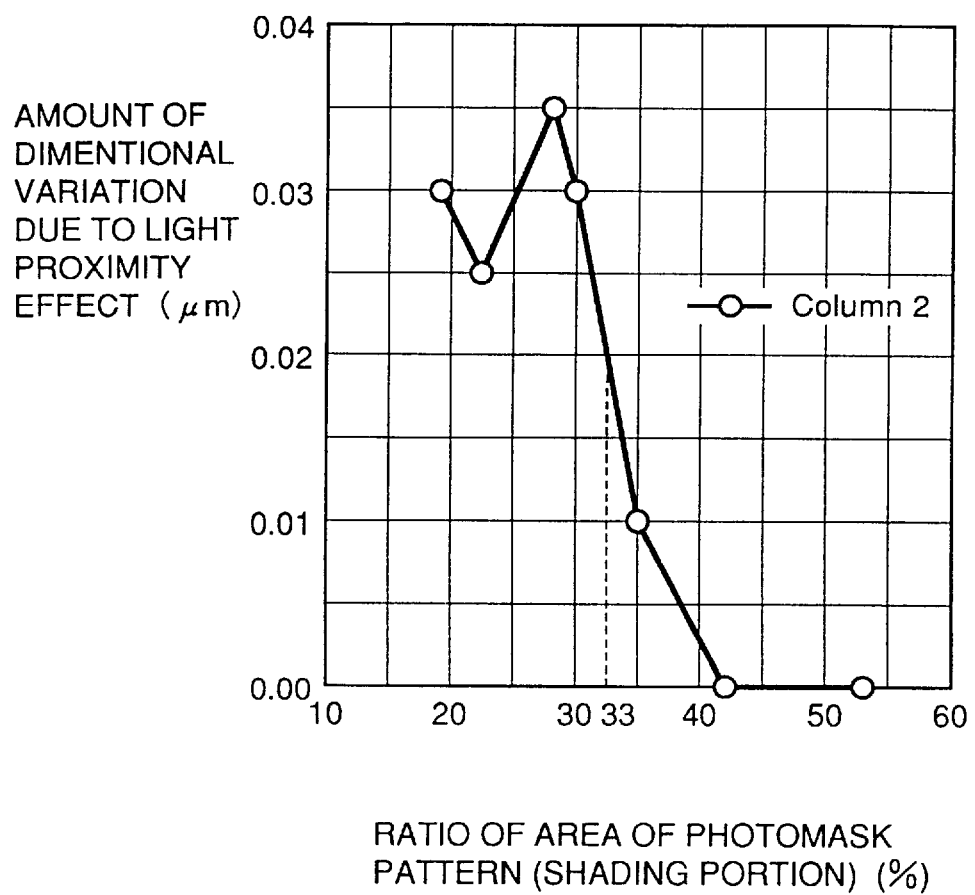
FIG. 9 shows a relation between the amount of dimensional variation due to the light proximity effect and the ratio of the area occupied by the photomask pattern (shading portion) in the second embodiment.

According to a method of correction for the light proximity effect in the second embodiment, a constant amount of dimensional variation (0.02 μm) is provided when the area ratio of the photomask pattern is 33% or less as shown in FIG. 9. This method applies to the case where less precise but more rapid correction is needed than in the first embodiment.

The amount of dimensional variation of 0.02 μm is determined as an average of the amounts of dimensional variation 0.01 μm to 0.03 μm, for the photomask pattern required for the light proximity effect correction. The calculation time required for the simulation can further be reduced compared with the first embodiment, since a simulation of the optical image after the photomask pattern data is processed becomes unnecessary, by using the constant amount of dimensional variation due to the light proximity effect.

Third Embodiment

According to a method of correcting the light proximity effect in this embodiment, an optical condition of resist material exposed by the light transmitted through the photomask is further taken into consideration in addition to the relation between the area ratio of the photomask pattern and the amount of dimensional variation due to the light proximity effect shown in FIG. 2. The amount of variation due to the light proximity effect can thus be determined more precisely.

Figure 10:
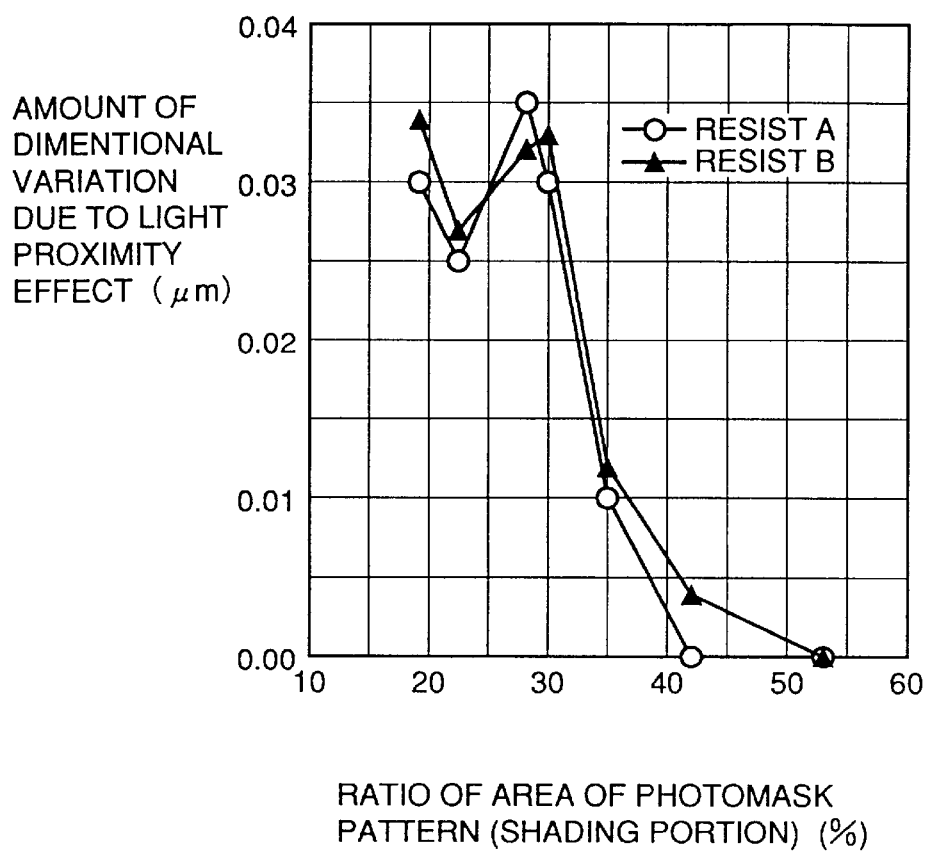
FIG. 10 shows a relation between the amount of dimensional variation due to the light proximity effect and the ratio of the area occupied by the photomask pattern (shading portion) in the third embodiment.

With reference to the graph shown in FIG. 10, the data on Resist film A is the same as the data shown in FIG. 2, and the data on Resist film B is derived when a resist film different from Resist film A is used.

Resist film A is I-line positive resist i8300B (film thickness: 7500 Å) fabricated by Mitsubishi Chemical Corporation, and Resist film B is I-line positive resist i8000 (film thickness: 7500 Å) fabricated by Mitsubishi Chemical Corporation.

As the result of the experiment clearly shows in FIG. 10, as for Resist film A, the amount of variation due to the light proximity effect is 0 if the area ratio of the photomask pattern is 40% or more as described in the first embodiment. On the other hand, as for Resist film B, the amount of dimensional variation due to the light proximity effect is 0 if the area ratio of the photomask pattern is 50% or more. When Resist film B is used, values of Equation (2) differ and the amount of dimensional variation applied to the divided side which needs a correction also differs.

By taking the optical condition of the resist material exposed by the light transmitted through the photomask into consideration, the amount of dimensional variation applied to the divided side for correction can be determined more precisely.

Fourth Embodiment

According to a method of correcting the light proximity effect in this embodiment, different from the method of the first embodiment, the decision distance is determined considering effects which vary depending on a distance from an exposure point to other exposure points in the circle having decision distance (d1) as a radius. As a result, the amount of dimensional variation due to the light proximity effect can be highly precisely determined.

Figure 11:
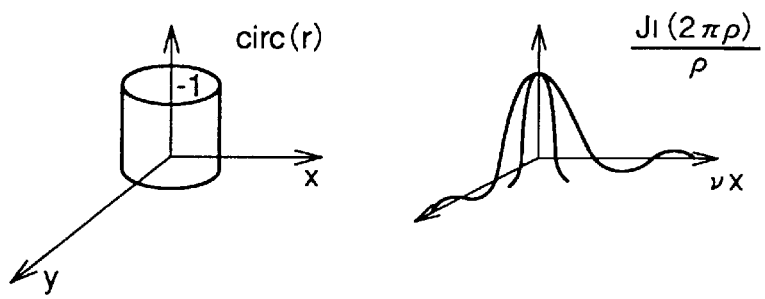
FIG. 11 shows a relation between Fourier transform and Bessel function in the fourth embodiment.

Exposure light which is transmitted through the photomask and produces a pattern has coherence. As shown in FIG. 11, Fourier transform of a point image of an exposure point can be expressed by Bessel function.

The Bessel function is a function of a distance from a point where there is generated diffracted light. The longer the distance, the weaker the light intensity of the optical image and the weaker its influence. In an exposure apparatus, a light source of exposure light is considered to be a mass of point light sources. In this case, a similar phenomenon is observed, and an exposure point is influenced more strongly by the other closer exposure point. Therefore, a decision distance d1' is actually determined using Equation (3) derived from Equation (1) multiplied by a coefficient k.

$$d1'=k\cdot\lambda/NA(1-\sigma)$$

λ: wavelength

NA: numerical aperture

σ: partial coherence

In this way, reference ratio for decision can be determined from Equation (4) considering an influence of other exposure points in the circle having a radius of decision distance d1'.

$$Sall=a\cdot S'+S \tag{4}$$

Sall: reference area ratio for decision

S: ratio of photomask pattern area to a portion between circles with radius of d and of d'

Figure 12:
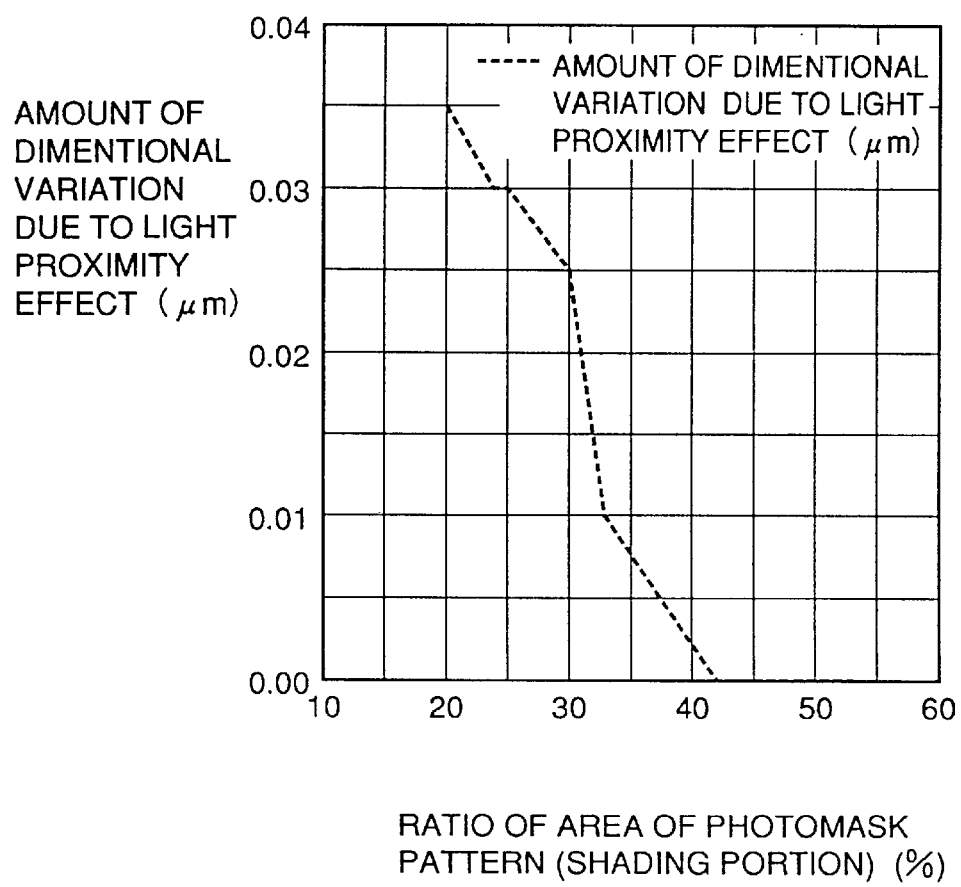
FIG. 12 shows a relation between the amount of dimensional variation due to the light proximity effect and the ratio of the area occupied by the photomask pattern (shading portion) in the fourth embodiment.
Figure 13A:
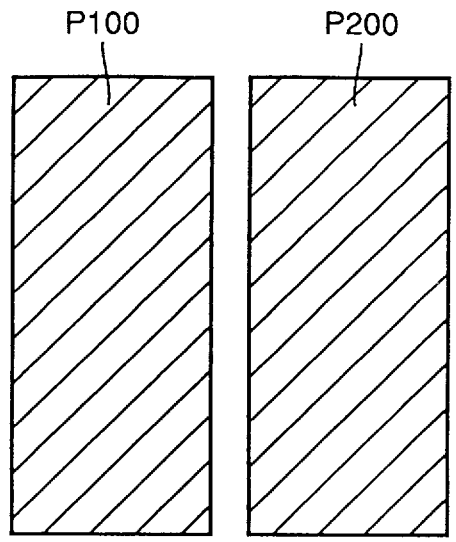
FIGS. 13A and 13B are an illustration showing the variation in dimension due to the light proximity effect.
Figure 13B:
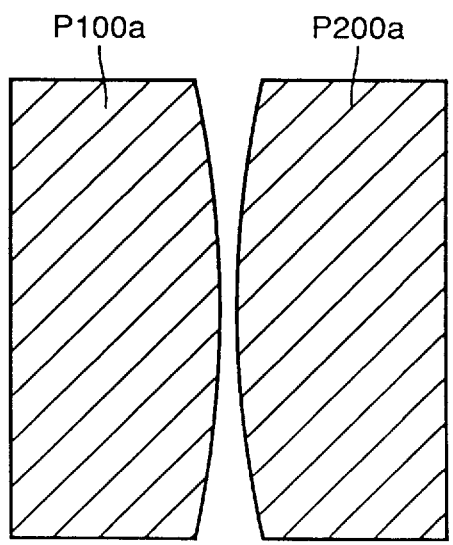
Figure 14:
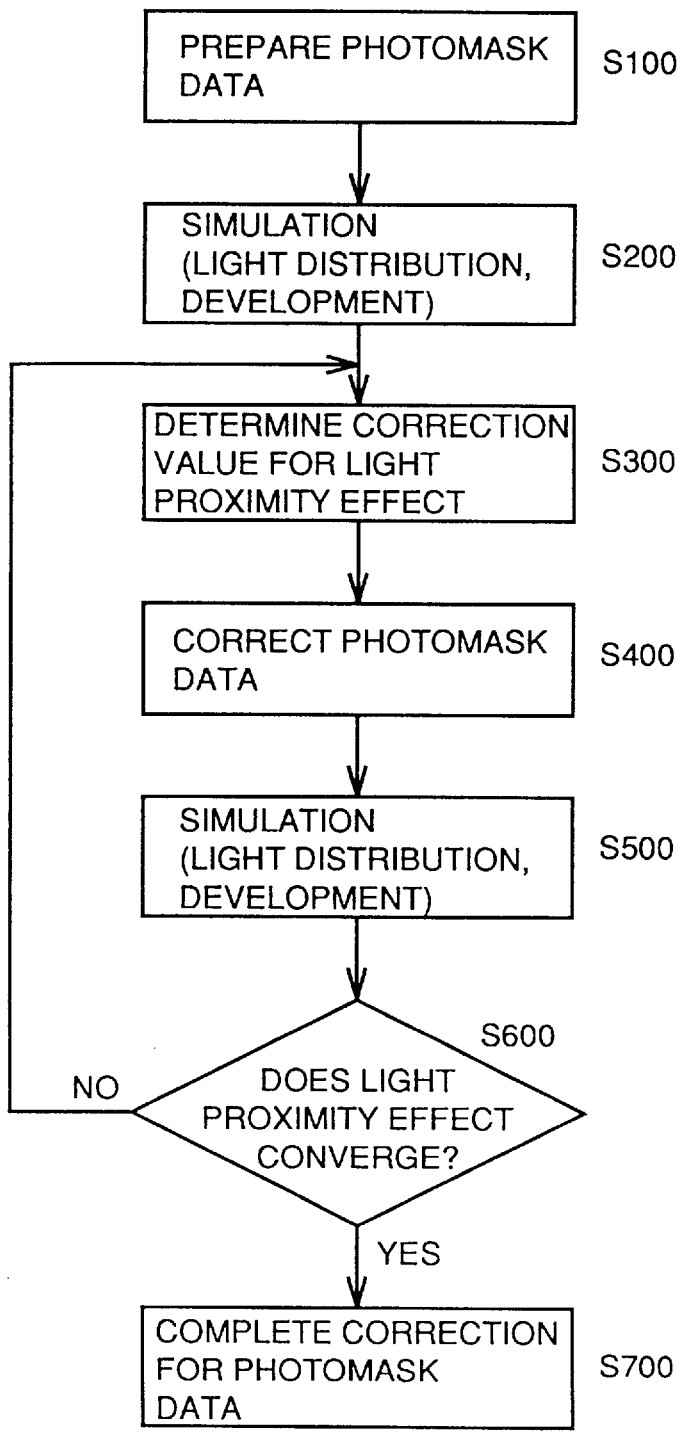
FIG. 14 is a flow chart showing the conventional method of correcting the light proximity effect.

S': ratio of photomask pattern area to a circle with radius of d' and exposure point as center a: coefficient If the optical condition is that used in the first embodiment and d1=1.6 μm, d1'=0.8 μm, k=0.5, a relation between the amount of dimensional variation due to the light proximity effect and the area ratio of the photomask pattern is as shown in FIG. 12. The amount of dimensional variation can be obtained more precisely compared with the first embodiment.

According to the method of correcting light proximity effect based on the present invention, respective sides of the photomask pattern are divided into portions each of a prescribed length, a decision is made for each divided side as to whether the light proximity effect correction is necessary or not, and photomask pattern data is corrected only for the divided side which needs the light proximity effect correction. Accordingly, the simulation is done for only the corrected data, thereby reducing greatly the calculation time required for the simulation compared with the conventional method of correcting the light proximity effect in which the simulation is done for all the data.

By dividing each side of the photomask pattern as fine as possible, highly precise correction can be made.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of correcting for a light proximity effect on selected portions of photomask pattern data for a photomask pattern to be formed on a photomask by exposure to a light source in an exposure apparatus, said method comprising the steps of:

(a) calculating a reference area ratio indicative of an area occupied by said photomask pattern within a circle having an exposure point where the light proximity effect appears as a center and a decision distance as a radius;

(b) subdividing sides of said photomask pattern into divided portions each having at most a prescribed length;

(c) selecting a selected portion from among said divided portions based on a comparison of said reference area ratio with an area ratio indicative of an area occupied by said photomask pattern within a circle having a middle point of said selected portion as a center and said decision distance as a radius; and (d) correcting photomask pattern data corresponding to said selected portion of the photomask pattern.

2. The method of claim 1, wherein said step of selecting said selected portion includes a step of selecting said selected portion further based on an optical condition of a material to be exposed using said photomask pattern.

3. The method of claim 1, wherein said step of selecting said selected portion includes a step of selecting said selected portion further based an influence of another exposure point in the circle having said decision distance as a radius.

4. The method of claim 1, further comprising the step of:

calculating a decision distance based on values of a wavelength, a numerical aperture, and a partial coherence of said light source.

5. The method of claim 4, wherein said step of calculating the decision distance includes a step of determining said decision distance using an equation $$d1 = \lambda/NA(1-\sigma)$$

where d1 is said decision distance, $\lambda$ is said wavelength, $\sigma$ is said partial coherence, and NA is said numerical aperture.

6. The method of claim 1, wherein the step of correcting said photomask pattern data includes the step of correcting said photomask pattern data corresponding to said selected portion of the photomask pattern based on an amount of dimensional variation due to the light proximity effect obtained from said reference area ratio for said selected portion.

* * * * *